United States Patent
Abbott

(10) Patent No.: US 7,608,916 B2
(45) Date of Patent: Oct. 27, 2009

(54) ALUMINUM LEADFRAMES FOR SEMICONDUCTOR QFN/SON DEVICES

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 468 days.

(21) Appl. No.: 11/345,754

(22) Filed: Feb. 2, 2006

(65) Prior Publication Data

US 2007/0176267 A1    Aug. 2, 2007

(51) Int. Cl.
*H01L 23/495* (2006.01)

(52) U.S. Cl. .................. 257/677; 257/672; 257/676; 257/E23.035; 438/123

(58) Field of Classification Search .......... 257/666–677
See application file for complete search history.

(56) References Cited

U.S. PATENT DOCUMENTS

| 6,518,647 | B1 | 2/2003 | Tellkamp |
| 6,747,343 | B2 | 6/2004 | Tellkamp |
| 6,933,177 | B2 | 8/2005 | Tellkamp |
| 7,023,074 | B2 * | 4/2006 | Li et al. .............. 257/666 |
| 2002/0061607 | A1 | 5/2002 | Akram |
| 2003/0006492 | A1 * | 1/2003 | Ogasawara et al. ....... 257/684 |
| 2004/0183170 | A1 * | 9/2004 | Tomimatsu ............ 257/666 |
| 2005/0287709 | A1 | 12/2005 | Lee et al. |

* cited by examiner

*Primary Examiner*—Leonardo Andújar
(74) *Attorney, Agent, or Firm*—Yingsheng Tung; Wade J. Brady, III; Frederick J. Telecky, Jr.

(57) ABSTRACT

A post-mold plated semiconductor device has an aluminum leadframe (105) with a structure including a chip mount pad and a plurality of lead segments without cantilevered lead portions. A semiconductor chip (210) is attached to the chip mount pad, and conductive connections (212) span from the chip to the aluminum of the lead segments. Polymeric encapsulation material (220), such as a molding compound, covers the chip, the connections, and portions of the aluminum lead segments without leaving cantilevered segment portions. Preferably by electroless plating, a zinc layer (301) and a nickel layer (302) are on those portions of the lead segments, which are not covered by the encapsulation material including the aluminum segment surfaces (at 203*b*) formed by the device singulation step, and a layer (303) of noble metal, preferably palladium, is on the nickel layer.

11 Claims, 2 Drawing Sheets

ALUMINUM LEADFRAMES FOR SEMICONDUCTOR QFN/SON DEVICES

FIELD OF THE INVENTION

The present invention is related in general to the field of semiconductor devices and processes, and more specifically to the materials and fabrication of leadframes for small integrated circuit devices and semiconductor components.

DESCRIPTION OF THE RELATED ART

Since the introduction of the concept of Quad Flat No-Lead (QFN) and Small Outline No-Lead (SON) packages for semiconductor devices, these packages have been on a steep learning curve for miniaturization. Today, some members of these categories are favorites in semiconductor applications due to the small package size (area as well as thickness). Hand in hand, however, with the scaling of package dimensions grew the technical challenges to maintain package reliability and optimize resistance against delamination, corrosion, warpage, and thermomechanical stress. The decisive factor in these reliability efforts is the leadframe of the package.

Leadframes for semiconductor devices provide a stable support pad for firmly positioning the semiconductor chip, usually an integrated circuit (IC) chip, within a package. It has been common practice to manufacture single piece leadframes from thin (about 120 to 250 µm) sheets of metal. For reasons of easy manufacturing, the commonly selected starting metals are copper, copper alloys, or iron-nickel alloys (for instance the so-called "Alloy 42"); aluminum is difficult to work with in devices which require bending of external leads. The desired shape of the leadframe is stamped or etched from the original sheet.

In addition to the chip pad, the leadframe offers a plurality of conductive segments to bring various electrical conductors into close proximity of the chip. The remaining gaps between the inner end of the segments and the contact pads on the IC surface are bridged by connectors, typically thin metal wires such as gold individually bonded to the IC contact pads and the leadframe segments. Consequently, the surface of the inner segment ends has to be metallurgically suitable for stitch-attaching the connectors.

The end of the lead segments remote from the IC chip ("outer" ends) need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts.

Finally, the leadframe provides the framework for encapsulating the sensitive chip and fragile connecting wires. Encapsulation using plastic materials, rather than metal cans or ceramic, has been the preferred method. The transfer molding process for epoxy-based thermoset compounds at 175° C. has been practiced for many years; the temperature of 175° C. for molding and mold curing (polymerization) is compatible with the temperature of >200° C. for solder reflow.

Device applications in moist environments require good adhesion between the encapsulated leadframe portions and the molding compound. Two major contributors to good adhesion are the chemical affinity between the molding compound and the metal finish of the leadframe, and the surface roughness of the leadframe.

In recent years, a number of technical trends have made it more and more complicated to find a satisfactory solution for maintaining good adhesion. As an example, the shrinking package dimensions offer less surface for adhesion. Then, the requirement to use lead-free solders pushes the reflow temperature range into the neighborhood of about 260° C.

SUMMARY OF THE INVENTION

Applicant recognizes that using aluminum as leadframes according to this invention provides many advantages over the leadframes used today, since un-plated aluminum offers strong bonds to gold wires and excellent adhesion to molding compounds. In addition, all leadframe portions still exposed after encapsulation and after device singulation can be plated with solderable metal layers, which simultaneously protect the leadframe against corrosion. The leadframe and its method of fabrication are flexible enough to be applied for different semiconductor product families and a wide spectrum of design and assembly variations, especially for QFN and SON devices. The method can also achieve improvements toward the goals of higher process yields and device reliability.

One embodiment of the invention is a post-mold plated semiconductor device with an aluminum leadframe. The leadframe structure includes a chip mount pad and a plurality of lead segments without cantilevered leads. A semiconductor chip is attached to the chip mount pad, and conductive connections span from the chip to the aluminum surface of the lead segments. Polymeric encapsulation material, such as a molding compound, covers the chip, the connections, and portions of the lead segments. A layer of nickel is on those portions of the lead segments, which are not covered by the encapsulation material, and a layer of noble metal, preferably palladium, is on the nickel layer.

The present invention is related to high density integrated circuits, including those having high numbers of inputs/outputs, and to device packages without cantilevered leads, especially to leadless device packages. These devices can be found in many semiconductor families such as standard linear and logic products, processors, digital and analog devices, high frequency and high power devices, and both large and small area chip categories. The invention also represents a significant cost reduction of the semiconductor package compared to the ones having conventional copper (or iron-nickel alloy) leadframes.

Another embodiment of the invention is a method for fabricating a semiconductor device. A sheet of aluminum is provided and a leadframe structure is etched from the sheet. The structure includes a chip mount pad and a plurality of lead segments without cantilevered leads. A semiconductor chip with bond pads is mounted on the chip mount pad, and the chip bond pads are interconnected to the aluminum surfaced of the respective lead segments. The chip, the interconnections, and portions of the lead segments are encapsulated in polymeric material. Next, those lead segment portions, which are not covered by polymeric material, are zincated and plated (by an electroless method) with a layer of nickel followed by a layer of a noble metal, preferably palladium.

It is a technical advantage of the present invention to provide the aluminum leadframes so that surface mount technologies based on solder for attaching lead portions (with water-soluble flux or mild fluxes not requiring rinse steps) can be continued. The end user of the semiconductor product can continue to employ the installed assembly equipment base.

It is another technical advantage to provide easy bondability under the conditions defined by fine pitch bonding.

As a further advantage, the present invention provides the aluminum leadframes so that they exhibit good adhesion to the molding compounds used in plastic packages, thus preventing moisture ingress and corrosion, and also exhibit good corrosion protection of the leads by the post-mold plating process.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
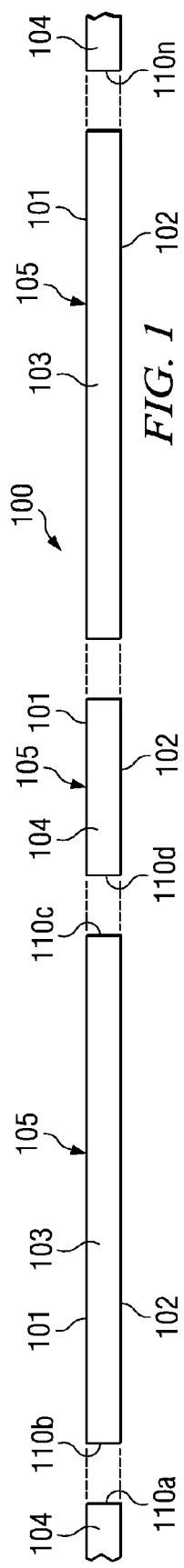
FIG. 1 is a schematic cross section of the base metal structure of a portion of an aluminum leadframe strip with formed leadframe structures.

In conventional surface mount packages for semiconductor devices, which have cantilevered leads bent in a small-outline S-shape or J-shape, the leadframe material is expected to provide the ductility to offer an elongation of at least 5 to 10% in order to satisfy the requirements of outer segment forming, which is usually the last process step in the fabrication flow. The metal ductility needed for the forming process is readily provided by the ductility of copper or copper alloy as starting material. On the other hand, to provide a similar metal ductility with aluminum as starting material of the leadframe is much more challenging. Material characteristics such as thermal history, alloyed mixtures, or plated surface metal layers have to be carefully selected in order to make aluminum suitable as base material for leadframes with cantilevered leads.

Applicant recognizes that these requirements and limitations become much less of concern in leadframes, which lack cantilevered leads, as in devices with Quad Flat No-Lead (QFN) and Small Outline No-Lead (SON) packages. Applicant further recognizes that other specific requirements, which dominate QFN and SON devices, can be uniquely satisfied by untreated aluminum as leadframe material. To these specific requirements belong strong adhesion between the leadframe surface and the encapsulating polymer material (the area available for adhesion is miniaturized), and good bond characteristics for attaching bonding wires. Finally, the un-encapsulated leadframe portions have to be amenable to low-cost plating techniques in order to deposit solderable metal layers.

According to the present invention, these diverse requirements can be met by aluminum as the leadframe base metal. The invention describes the base material of leadframes, the assembly and packaging of semiconductor chips on these leadframes, and the process of treating the base material after packaging so that the devices become suitable for board assembly and other applications.

The density of aluminum or aluminum alloy is 2.7 g/cm$^3$, the Young's Modulus is 72.5·10$^3$ N/mm$^2$, and the thermal coefficient of expansion is 24.7 ppm/° C. In comparison, copper or copper alloy has a density of 8.93 g/cm$^3$ with a Young's Modulus of 120×10$^3$ N/mm$^2$, and a thermal coefficient of expansion of 17.6 ppm/° C. These copper properties contribute to problems, when copper is used as base material for semiconductor leadframes: High mass of leadframe base metal; high thermo-mechanical stress levels on silicon chips; and high thermo-mechanical stress levels on solder joints in board attach.

Roughly, aluminum is ⅓ the density of copper, and will reduce the mass (weight) of leadframe base materials. The lower Young's modulus of aluminum will help compensate for the higher thermal coefficient of expansion relative to thermo-mechanical stress. Stress levels will be reduced for aluminum alloys compared to copper alloys, since the coefficient of thermal expansion multiplied by the Young's modulus is less than that for copper alloys. The thermal conductivity of aluminum is similar to the thermal conductivity of copper. Given the dimensions of typical leadframes, the lower electrical conductivity of aluminum plays a subordinate role compared to the unavoidable conductivity loss in the thin bonding wires.

Furthermore, the difference of the cost of the raw materials is significant. For copper or copper alloy, the recent raw material cost is approximately 2.13 $/kg, for aluminum or aluminum alloy only 1.08 $/kg. Considered together with the densities quoted above, aluminum has about a 6.5× cost advantage.

Leadframes made of aluminum for QFN and SON devices have a chip pad for support of the semiconductor chip, surrounded by un-cantilevered segments having an inner tip in proximity of the chip pad, and outer tips remote from the chip pad. The inner segment tips are suitable for bond attachments to connecting wires; the outer segment tips can be prepared (see below) to become suitable for solder attachment to external parts. The untreated aluminum surface, especially when oxidized, is amenable to adhesion to molding compounds.

The insensitivity to corrosion of the leadframe portions, which are not encapsulated, is provided by a process flow, which leaves no exposed aluminum and creates a sequence of protective layers deposited over the aluminum surface, specifically a nickel layer followed by a noble metal layer (or layers) as the outermost layer.

According to the teachings of this invention, the solderability of the aluminum leadframes is achieved by first encapsulating the assembled semiconductor chip and portions of the leadframe, and then depositing a layer of zinc, a layer of nickel, and an outermost layer of a noble metal over the un-encapsulated aluminum portions. When the noble metal is dissolved in the solder operation, the solder joint is made to the nickel surface.

The invention satisfies the bondability need of the leadframe by bonding gold wires directly to the aluminum of the leadframe material.

Applicant's experiments have shown that excellent adhesion can be achieved between polymeric encapsulants, or molding compounds, and aluminum and/or oxidized aluminum. This adhesion is strong enough to withstand accelerated reliability device tests in moist environments and elevated temperatures, and prevents delamination between the leadframe and polymeric encapsulant.

For QFN/SON devices, the invention provides low device warpage due to the relatively closely matched coefficients of thermal expansion of aluminum and the preferred molding compounds.

FIG. 1 illustrates a schematic cross section of a leadframe strip generally designated 100, which is intended to be used on the fabrication of a semiconductor devices according to the invention. The leadframe strip has a structure made from a sheet of metal, wherein the structure has a plurality of surfaces: the first surface 101, the second surface 102, and numerous side edge surfaces 110a, 110b, 110c, 110d, . . . 110n. While the surfaces 101 and 102 originate from the surfaces of the sheet of the starting material, the side edge surfaces 110a to 110n have been created by the forming process of the leadframe structure. In the example of FIG. 1, the leadframe portion depicted contains a plurality of portions 103, which are intended to become chip mount pads, and a plurality of portions 104, which are intended to become the lead segments of the devices-to-be-built.

The leadframe is made of a base metal 105. As defined herein, the starting material of the leadframe is called the "base metal", indicating the type of metal. Consequently, the term "base metal" is not to be construed in an electrochemical sense (as in opposition to 'noble metal') or in a structural sense.

The base material 105 of the leadframes are aluminum sheets in the preferred thickness range from 100 to 300 µm; thinner sheets are possible. These sheets are commercially available, for example, from the division "Tennalum" of Kaiser Aluminum Corporation, Jackson, Tenn., USA. The material preferred by this invention is an alloy of aluminum with manganese (series 3xxx, for instance 3004, wherein the digits in the alloy designation indicate alloy modifications). Other alloys are manufactured, for example, with copper, silicon, magnesium, and zinc. These aluminum and aluminum alloy sheets come in modifications of various thermal histories, such as tempered, annealed, or strain hardened, resulting is various hardnesses.

When the leadframe is to be used for QFN/SON devices, mechanical strength of the base metal is not a critical factor, since there are no unsupported leads, and the mold compound provides a mechanically sound device package.

The leadframe parts such as chip mount pads, lead segments, connecting rails (not shown in FIG. 1, but hinted at by dashed lines) are preferably etched from the starting metal sheet. The preferred low-cost and fast etching method uses a caustic etchant such as the non-oxidizing hydrochloride acid HCl (aluminum dissolves in HCl while developing hydrogen). As stated, these etching processes create numerous side edges 110a, 110b . . . 110n, of the leadframe parts.

Figure 2:
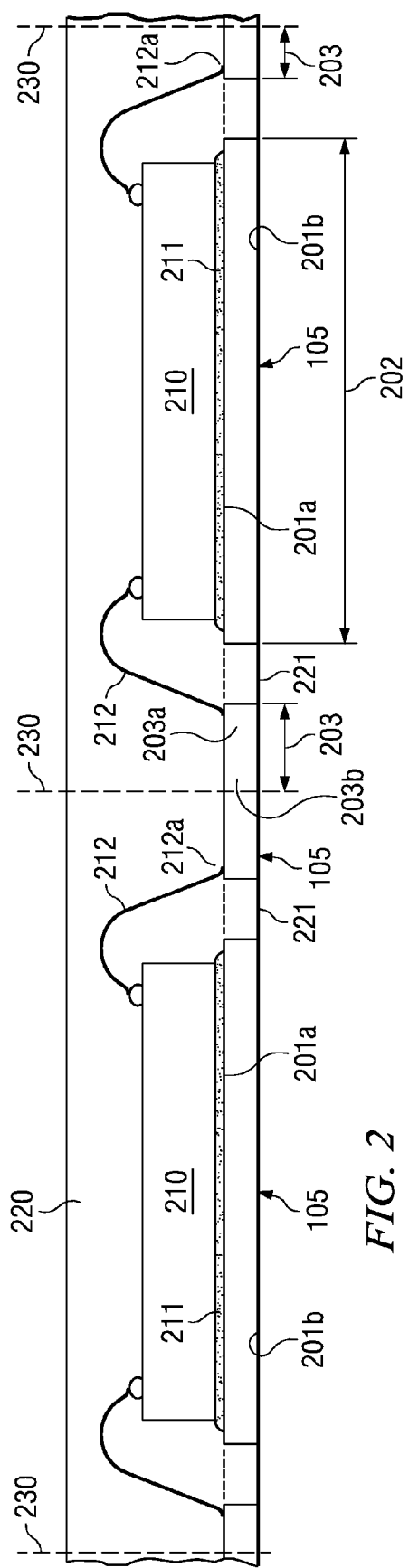
FIG. 2 illustrates a schematic cross section of a device embodiment of the invention, showing a portion of a leadframe strip, prepared according an embodiment of the invention, and a plurality of semiconductor chips assembled and encapsulated on one leadframe surface.

FIG. 2 illustrates the next steps of fabricating a semiconductor device according to the invention, exemplified by the QFN or SON device still at the stage of a leadframe strip with a plurality of assembled and packaged devices before device singulation. At the stage of FIG. 2, the device has a leadframe with a structure made from a sheet of aluminum base metal 105; the sheet has a first surface 201a and a second surface 201b. The leadframe structure in FIG. 2 includes chip mount pads 202 and pluralities of lead segments 203. Each lead segment 203 has a first end 203a near chip mount pad 202, and a second end 203b remote from mount pad 202. The first leadframe surface 201a and all side edges of the structure have aluminum or aluminum oxide surfaces and thus provide the leadframe with reliable adhesion to polymeric materials and metallurgical affinity to gold wire bonding.

A semiconductor chip 210, for example a silicon integrated circuit chip, is attached by means of an adhesive layer 211 to each chip mount pad 202. Conductive connections 212, such as bonding wires (or ribbons) preferably made of gold or gold alloy, span from chip 210 to the lead segments 203 and interconnect the chip with the first ends 203a of the lead segments (alternatively, connections 212 may be copper or aluminum wires). The stitch bond 212a is pressure bonded to the aluminum for reliable stitch attachment.

Polymeric encapsulation material 220, for example epoxy-based molding compound, covers chip 210, bonding wires 212, and portions of the lead segments 203. The polymeric material 220 also fills the gaps between chip 210 and the first ends 203a of the lead segments and thus covers the leadframe side edges. In QFN/SON devices, the polymeric compound 220 forms a surface 221 coplanar with (in the same plane as) the second leadframe surface 201b. Polymeric material 220 leaves the second leadframe surface 201b not covered. These exposed portions of the second leadframe surface are thus available to be contacted by solder reflow metals.

In FIG. 2, dashed lines 230 indicate the locations, where a saw will cut (or a punch will singulate) the completed leadframe strip into individual devices of the QFN/SON package type. The saw (or the punch) is cutting through encapsulation material 420 as well as through the aluminum leadframe segments. Consequently, the sawing (punching) step freshly creates side surfaces of the aluminum leadframe metal at the remote segment ends 203b.

It is advantageous to perform the singulation step of the encapsulated units of the strip so that selected polymeric tie straps continue to connect the units and thus preserve the strip coherence (not indicated in FIG. 2). With the connecting straps, the strip can be processed through the following fabrication steps as a single entity, allowing cost effective execution of all process steps. After completion of the last process step (forming of the noble metal layer), the polymer tie straps may be broken to separate the completed devices. Alternatively, the strap breaking may be postponed until final device application in the end-user's house.

When the leadframe at the beginning of the device fabrication flow was already an individual unit rather than a strip of units, the sawing (or punching) step is not needed to create a singulated device.

In the next process step of the device fabrication, the exposed surfaces 201b of the chip pad and the lead segments as well as the sidewalls freshly formed by the sawing/punching action are prepared for the deposition of layers of to reflow solder alloys. The devices are first immersed in an alkaline preclean solution at 20 to 90° C. for few seconds up to 3 minutes. Any oils and other contamination are thereby removed from the aluminum surfaces.

After rinsing, the devices are next immersed in an acid activation bath at room temperature for few seconds up to 5 minutes. The bath consists of a solution of nitric acid or nitric/sulfuric acid solution, preferably at about 30 to 60 g/l concentration. This solution removes aluminum oxide and leaves the metallic aluminum surface in an activated state, ready to accept the deposition of metallic zinc.

For the zinc deposition, the activated aluminum or aluminum alloy sheet is immersed in a zincate such as the "Bondal" solution commercially available form the Canning Gumm Company, Kearny, N.J., USA. The zincate is preferably at about 15 to 50° C.; the immersion lasts from few seconds to about 5 minutes, and may be repeated in a separate exposure. The zinc layer (301 in FIG. 3) may only be a thin film, but should cover the aluminum surface without interruption. Its function is solely to establish the reliable adhesion of the following nickel layer to the aluminum.

The nickel layer 302 is deposited so that the deposition solution does not electrochemically attack the zinc layer. Consequently, the nickel layer is preferably deposited by an electroless method. Typically, the solution is between −25 and +60° C. and the deposition lasts from about 1 to 10 minutes. The thickness of the electroless nickel layer 302 is preferably between about 0.5 and 3 µm. Alternatively, an alkaline electro-nickel process may be used. The overall thickness of the two layers 301 and 302 is in the range of 650 and 4000 nm.

Figure 3:
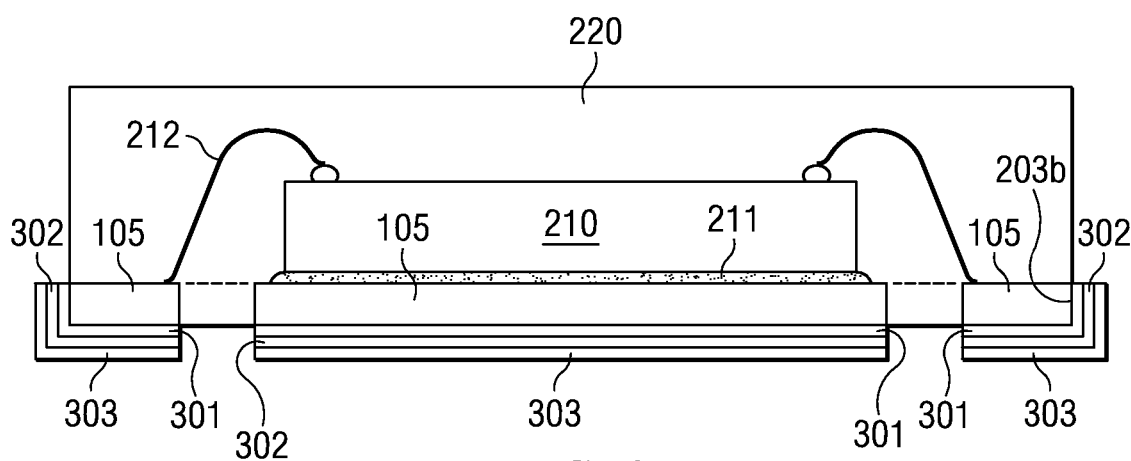
FIG. 3 illustrates a schematic cross section of a singulated device of the QFN/SON type, which includes a post-mold plated leadframe prepared according to the invention.

The outermost layer 303 of the embodiment in FIG. 3 includes a noble metal selected from a group consisting of palladium, rhodium, gold and silver; the preferred choice is palladium. The noble metal layer is preferably deposited by an electroless method. Layer 303 is preferably between 10 and 75 nm thick; its main purpose is to protect the nickel surface from oxidation and thus ensure its reliable solderability. Alternatively, the noble metal layer may consist of a stack of two noble metal layers, for example a palladium layer on the nickel layer and an outermost gold layer on the palladium layer.

If desired, a layer of reflow solder metals, usually based on tin or a tin alloy, may be deposited; in this case, noble metal layer 303 is not needed.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the process step of etching the leadframes from a sheet of base metal may be followed by a process step of selective etching, especially of the exposed base metal surfaces in order to create large-area contoured surfaces for improved adhesion to molding compounds. The sequence of plated layers according to the invention can accommodate any such specially etched leadframe base structures.

It is therefore intended that the appended claims encompass any such modifications or embodiment.

I claim:

1. A semiconductor device without cantilevered leads, comprising:

a leadframe made of aluminum alloy and having a structure including a chip mount pad and a plurality of lead segments;

a semiconductor chip attached to the chip mount pad;

conductive connections spanning from the chip to the aluminum surface of the lead segments;

polymeric encapsulation material covering the chip, the connections, and portions of the aluminum lead surface;

a zinc layer only on the aluminum lead surface that is not covered by the encapsulation material;

a nickel layer on the zinc layer; and a layer of noble metal on the nickel layer.

2. The device according to claim 1 further comprising reflow metals on the segment portions having the nickel layer.

3. The device according to claim 1 wherein the noble metal is palladium.

4. The device according to claim 3 further including a layer of gold over the layer of palladium.

5. The device according to claim 1 wherein the conductive connections are bonding wires made of gold.

6. The device according to claim 1 wherein the polymeric encapsulation is a molding compound.

7. A semiconductor device; comprising:

an polymeric material encapsulating an aluminum leadframe except a portion of lead segments;

the un-encapsulated portion of the leadframe covered by a zinc film;

the encapsulated portion of the leadframe free of zinc; and a conductive joint attached to the zinc covered portion of the leadframe, including a noble metal and nickel.

8. The semiconductor device of claim 7, further comprising a semiconductor chip affixed to the leadframe.

9. The semiconductor device of claim 8, in which the chip is encapsulated by the polymeric material.

10. The semiconductor device of claim 7, further comprising a conductive wire connecting the chip to an aluminum surface of the leadframe.

11. The semiconductor device of claim 10, in which the conductive wire includes copper.

* * * * *